United States Patent
Jacob et al.

(10) Patent No.: US 10,056,453 B2
(45) Date of Patent: Aug. 21, 2018

(54) SEMICONDUCTOR WAFERS WITH REDUCED BOW AND WARPAGE

(71) Applicant: GLOBALFOUNDRIES INC., Grand Cayman (KY)

(72) Inventors: Ajey Poovannummoottil Jacob, Watervliet, NY (US); Srinivasa R. Banna, San Jose, CA (US); Deepak K. Nayak, Union City, CA (US); Bartlomiej J. Pawlak, Leuven (BE)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/217,643

(22) Filed: Jul. 22, 2016

(65) Prior Publication Data

US 2018/0026096 A1  Jan. 25, 2018

(51) Int. Cl.
| | |
|---|---|
| *H01L 29/06* | (2006.01) |
| *H01L 23/00* | (2006.01) |
| *H01L 29/20* | (2006.01) |
| *H01L 29/16* | (2006.01) |
| *H01L 29/267* | (2006.01) |
| *H01L 21/02* | (2006.01) |
| *H01L 21/308* | (2006.01) |
| *H01L 21/3065* | (2006.01) |

(52) U.S. Cl.
CPC ...... *H01L 29/0657* (2013.01); *H01L 21/0254* (2013.01); *H01L 21/02381* (2013.01); *H01L 21/3065* (2013.01); *H01L 21/3083* (2013.01); *H01L 23/562* (2013.01); *H01L 29/16* (2013.01); *H01L 29/2003* (2013.01); *H01L 29/267* (2013.01)

(58) Field of Classification Search
None
See application file for complete search history.

(56) References Cited

U.S. PATENT DOCUMENTS

| | | | |
|---|---|---|---|
| 4,742,020 A | 5/1988 | Roy | |
| 6,876,534 B2 | 4/2005 | Tossell | |
| 8,835,988 B2* | 9/2014 | Marino | ............. H01L 21/02381 |
| | | | 257/200 |
| 2013/0037857 A1 | 2/2013 | Kanel et al. | |
| 2015/0206796 A1 | 7/2015 | Dasgupta et al. | |
| 2015/0295032 A1* | 10/2015 | Lao | ......................... H01L 29/78 |
| | | | 257/330 |

OTHER PUBLICATIONS

Gonzalez et al., "GaN Growth on Patterned Silicon Substrates. A thermo mechanical study on wafer bow reduction", IEEE 2012, 6 pages.

(Continued)

*Primary Examiner* — Long Pham
(74) *Attorney, Agent, or Firm* — Michael LeStrange; Andrew M. Calderon; Roberts Mlotkowski Safran Cole & Calderon, P.C.

(57) ABSTRACT

The present disclosure relates to semiconductor structures and, more particularly, to semiconductor wafers with reduced bowing and warping and methods of manufacture. The structure includes a substrate including plurality of trenches which have progressively different depths as they extend radially inwardly from an edge of the substrate towards a center of the substrate.

17 Claims, 5 Drawing Sheets

(56) References Cited

OTHER PUBLICATIONS

Wang et al., "Kinetic surface roughening and wafer bow control in heteroepitaxial growth of 3C-SiC on Si(111) substrates", Scientific Reports, 5, 2015, 8 pages.
Sun Tao et al., "Deflection Reduction of GaN Wafer Bowing by Coating or Cutting Grooves in the Substrates", Chin. Phys. Lett., 2011, 28(4):047303, 4 pages.
Falub et al., "Three Dimensional Heteroepitaxy: A New Path for Monolithically Integrating Mismatched Materials With Silicon", International Semiconductor Conference (CAS) vol. 1 and 2, 6 pages.

\* cited by examiner

SEMICONDUCTOR WAFERS WITH REDUCED BOW AND WARPAGE

FIELD OF THE INVENTION

The present disclosure relates to semiconductor structures and, more particularly, to semiconductor wafers with reduced bowing and warping and methods of manufacture.

BACKGROUND

Forming GaN on silicon wafers is a complex heteroepitaxial process where heterostructures of both compressive and tensile strain alloys (e.g., Al, Ga, In) are grown on silicon films. These compressive and tensile strains can cause bowing or warping of the semiconductor wafer. For example, a compressive strain can result in concave bowing, whereas, a tensile strain can result in a convex bowing.

There is a lattice and thermal mismatch between GaN and silicon. As is known, a lattice mismatch between silicon and GaN causes defects formation on GaN, e.g., too thick GaN can cause unwanted stress which can result in the warp. The thermal mismatch impact, on the other hand, happens after the growth and during the cooling of the wafer. The thermal mismatch between silicon and GaN can, for example, cause warp in silicon, peel off from silicon, and cracks in GaN.

To alleviate or compensate for the bowing, a post growth process is required to relax the strains on the semiconductor wafer (silicon wafer). This can create defects in the semiconductor wafer. Also, since the growth process is typically at a very high temperature (e.g., above 1000° C.), the silicon wafer becomes ductile and can easily be deformed. Also, compressive stress builds up during the growth at high temperature and tensile strain builds up during the cool down process, again resulting in potential warping or bowing of the semiconductor wafer. The bowing and warping of the wafer is amplified when GaN is grown on a 12 inch wafer, for example.

SUMMARY

In an aspect of the disclosure, a structure comprises a substrate comprising a plurality of trenches which have progressively different depths as they extend radially inwardly from an edge of the substrate towards a center of the substrate.

In an aspect of the disclosure, a structure comprises: a substrate; a plurality of trenches formed in the substrate and having progressively different depths as they extend radially inwardly from an edge of the substrate towards a center of the substrate; and a plurality of layers which generate a stress component on the substrate.

In an aspect of the disclosure, a method comprises: forming a plurality of trenches in a substrate having progressively different depths as they extend radially inwardly from an edge of the substrate towards a center of the substrate; and forming heterostructural layers within the plurality of trenches, the heterostructural layers generating a stress component on the substrate which is compensated by the plurality of trenches.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to semiconductor wafers with reduced bowing and warping and methods of manufacture. More specifically, the present disclosure provides methods of reducing bowing and warping of semiconductor wafers and substrates, particularly for silicon wafers with GaN epitaxially grown layers which can generate a stress component on the semiconductor wafers. Accordingly, the present disclosure provides semiconductor wafers without bowing or warping, particularly in heterostructures having either compressive and tensile strain alloys (e.g., Al, Ga, In).

It is understood by those of ordinary skill in the art that growing GaN on silicon substrates, e.g., wafers, generates compressive strain resulting in a concave bow. Alternatively, growing carbon based material on the silicon substrates, e.g., wafers, generates tensile strain resulting in a convex bow. In order to counter balance this bowing, the semiconductor wafers disclosed herein include trenches which balance the growth process of the strain materials. For example, in embodiments, the present disclosure provides aspect ratio trapping of GaN (or other material) heterostructures in predefined trench depth modulated templates to reduce bowing and warping of the wafer. The trench depths can be coupled with non-uniform stress components, either locally or globally. The processes described herein can be particularly useful in GaN based ILED devices for displays in the virtual reality (VR) and Augmented Reality (AR) industries.

The semiconductor structures of the present disclosure can be manufactured in a number of ways using a number of different tools. In general, though, the methodologies and tools are used to form structures with dimensions in the micrometer and nanometer scale. The methodologies, i.e., technologies, employed to manufacture the semiconductor structures of the present disclosure have been adopted from integrated circuit (IC) technology. For example, the structures are built on wafers and are realized in films of material patterned by photolithographic processes on the top of a wafer. In particular, the fabrication of the semiconductor structures uses three basic building blocks: (i) deposition of thin films of material on a substrate, (ii) applying a patterned mask on top of the films by photolithographic imaging, and (iii) etching the films selectively to the mask.

Figure 1A:
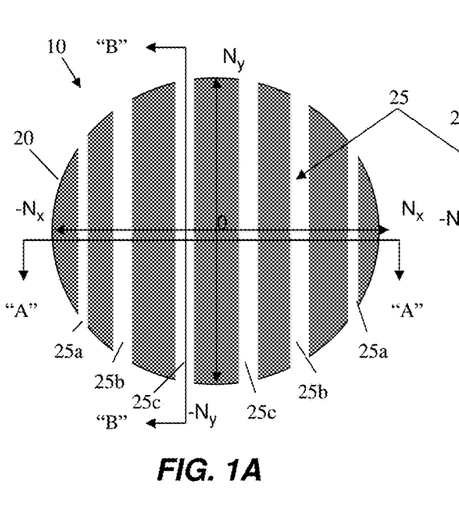
FIGS. 1A and 1B show top views of alternative structures and respective fabrication processes in accordance with aspects of the present disclosure.
Figure 1B:
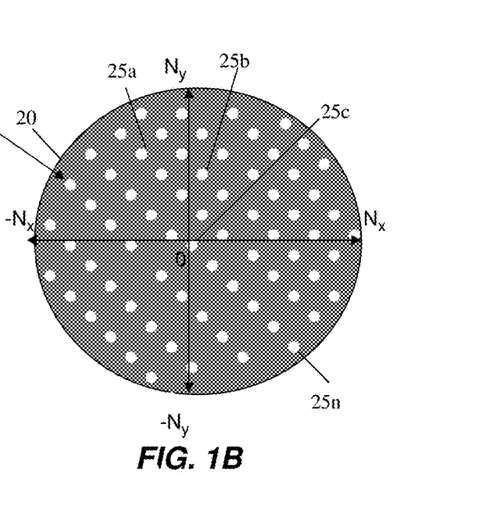

FIGS. 1A and 1B show top views of alternative structures and respective fabrication processes in accordance with aspects of the present disclosure. In particular, the structures 10 shown in FIGS. 1A and 1B each comprises a substrate 15 with a plurality of trenches 25. In embodiments, the substrate 15 is a wafer composed of Si; although any suitable semiconductor material is contemplated herein, e.g., SiGe, SiGeC, SiC, GaAs, InAs, InP, and other III/V or II/VI compound semiconductors.

The trenches 25 can be formed by conventional lithography and etching, e.g., reactive ion etching (RIE) processes, as described further with respect to FIGS. 9A-9D. In embodiments, the trenches 25 can be fabricated with a width ranging from about 0.5 microns to about 50 microns, and more preferably about 0.5 microns to about 10 microns. The spacing between the trenches 25 can be about 0.1 microns to about 10 microns, and the depth of the trenches 25 can range from about 1.0 microns to about 10.0 microns, depending on their location as described herein. In embodiments, the cross sections of each of the trenches 25 is preferably the same for uniform wire growth. It should be understood by those of skill in the art that the above noted dimensions are provided as illustrative, non-limiting examples, and other dimensions are also contemplated herein depending on the particular strain materials coating the substrate 10, their thicknesses and/or other characteristics.

As shown in each of the aspects described herein, the trenches 25 can be separate trenches (e.g., trenches 25a, 25b, 25c) extending longitudinally across the substrate 15 (FIG. 1A) or, alternatively, a plurality of discrete, circular trenches (e.g., trenches 25a, 25b, 25c . . . 25n) formed throughout the substrate 15 (FIG. 1B). Although FIG. 1A shows six (6) longitudinal trenches and FIG. 1B shows a plurality of trenches throughout the substrate 15, it should be understood by those of skill in the art that more or less trenches are contemplated herein depending on different factors such as, for example, the size of the substrate 15 (e.g., wafer), the thickness and type of the tensile or compressive strain material coating the substrate 15, etc.

As described further herein, the trenches 25a, 25b, 25c . . . 25n of FIGS. 1A and 1B can be of varying depths as they extend radially inward from an edge 20 of the substrate 15, e.g., depending on its distance away from an edge 20 of the substrate 15 and the strain material used to coat the substrate 15. For example, the trenches 25 shown in FIG. 1A can have a varying depth along its length; whereas, the discrete trenches 25 shown in FIG. 1B can have a different depth at the center of the substrate compared to the edge 20 of the substrate 15. In this way, more or less material can be at the center of the substrate 15 to compensate for a convex or concave bowing, respectively. In embodiments, the depth of the trenches 25 can vary using wet etching techniques with different width openings, e.g., wider or narrower opening. In embodiments, as should be understood by those of skill in the art, the wider the opening the stronger the etch. Also, the openings might be in any kind of geometrical shape, e.g., circle, triangles, squares etc. Moreover, the opening in the middle could be wider/broader for stronger recess.

By way of a more specific, non-limiting, illustrative example, each of the trenches 25a, 25b, 25c of FIG. 1A can become deeper along its length as they extend radially inward toward a center (e.g., center point "0") of the substrate 15 and shallower as they extend toward the edge 20 (e.g., extend towards Nx and −Nx of the x axis and Ny and −Ny along the y-axis). This will compensate for stresses caused by strain material which generates a concave bowing, e.g., a material providing a tensile stress (e.g., GaN); that is, this configuration will redirect the substrate 15 to a flat configuration. Alternatively, the trenches 25 can become shallower as they extend toward the center (e.g., center point "0") of the substrate 15 and deeper as they extend radially outward toward the edges 20 (e.g., extend towards Nx and −Nx of the x axis and Ny and −Ny along the y-axis). This will compensate for stresses caused by strain material which generates a convex bowing, e.g., a material providing a compressive stress (e.g., carbon based material); that is, this configuration will redirect the substrate 15 to a flat configuration. These same depth configurations are also contemplated for use with the trenches 25 shown in FIG. 1B.

Also, the trenches 25a, 25b, 25c . . . 25n shown in FIGS. 1A and 1B can have different cross-sectional profiles. For example, the longitudinal trenches 25a, 25b, 25c shown in FIG. 1A can have a rectangular cross-sectional profile (see, e.g., FIG. 2), trapezoidal or U-shaped or stepped cross-sectional profile (e.g., see FIG. 3) or triangular (V-shaped) cross-sectional profile (see, e.g., FIG. 4), amongst other profiles. Similarly, the trenches 25a, 25b, 25c . . . 25n shown in FIG. 1B can be representative of a circular, square, triangular, rectangular, trapezoidal or other profile. In embodiments, the trench shapes can vary, e.g. vertical side-wall in addition to V-shaped or retrograde side-wall, etc.

Figure 2:
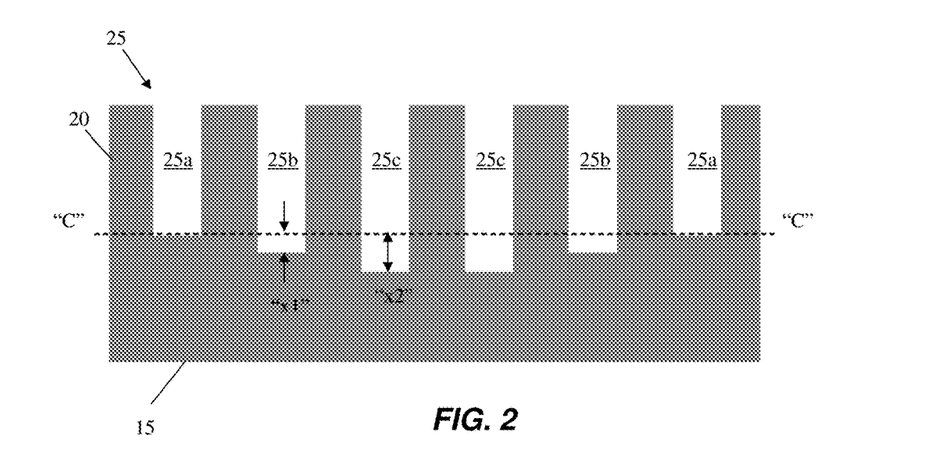
FIG. 2 shows a cross-sectional view of FIG. 1A along line "A"-"A".
Figure 3:
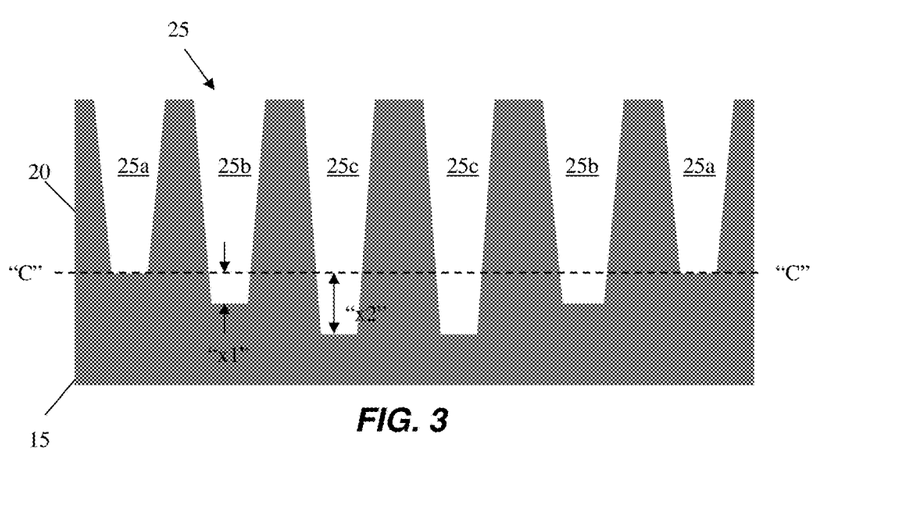
FIG. 3 shows an alternative cross-sectional view of FIG. 1A along line "A"-"A".
Figure 4:
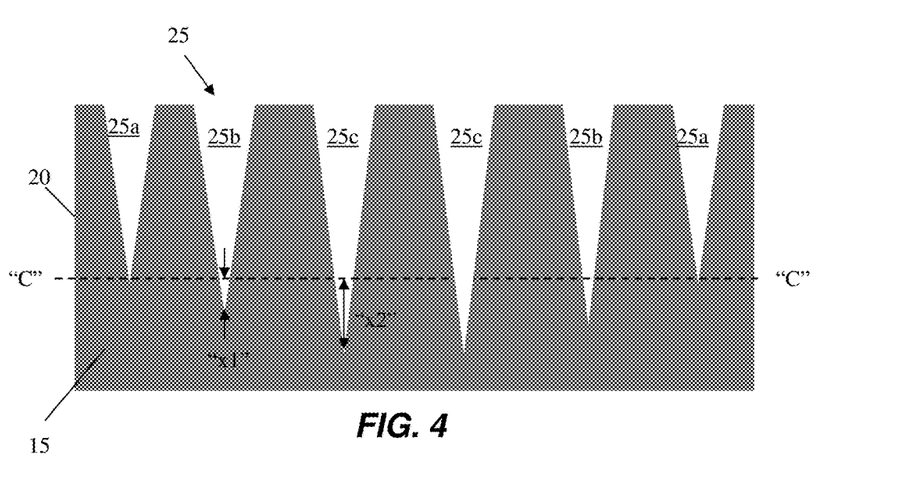
FIG. 4 shows yet another alternative cross-sectional view of FIG. 1A along line "A"-"A".

More specifically, FIGS. 2-4 show alternative cross-sectional views of FIG. 1A along line "A"-"A" (mid section). As shown in FIG. 2, each of the trenches 25a, 25b and 25c have a rectangular cross-section profile; whereas, FIG. 3 shows a trapezoidal or U-shaped or stepped cross-sectional profile and FIG. 4 shows a triangular (V-shaped) cross-sectional profile. In FIGS. 3 and 4, the trenches 25 have sidewalls along the 111 plane. Also, although FIGS. 3 and 4 show that the trenches 25 are uniformly etched across the substrate 15, other embodiments contemplate a non-uniform trench etch across the wafer to maintain the reduction in bowing.

In each of these different profiles shown in FIGS. 2-4, each portion of the trenches 25a, 25b and 25c farthest from the edge 20 can have a depth that is deeper than portions of the respective trenches closest to the edge 20 of the substrate. And, each trench 25a, 25b and 25c can include a sloped surface such that the portion of the trench closest to the center point of the substrate 15 will have the deepest profile in the case of compensating for a concave bowing of the substrate 15. Illustratively, as shown in FIGS. 2-4, for example, portions of the trenches 25c closest to the center of the substrate 15 will have a depth greater than portions of the trenches 25b farther from the center of the substrate 15, e.g., x2>x1 with respect to line "C"-"C". Alternatively, it should be understood by those of skill in the art that each trench 25a, 25b and 25c can include a sloped surface such that the portion of the trench closest to the center point of the substrate will have the shallowest profile in the case of compensating for a convex bowing of the substrate 15.

Figure 5:
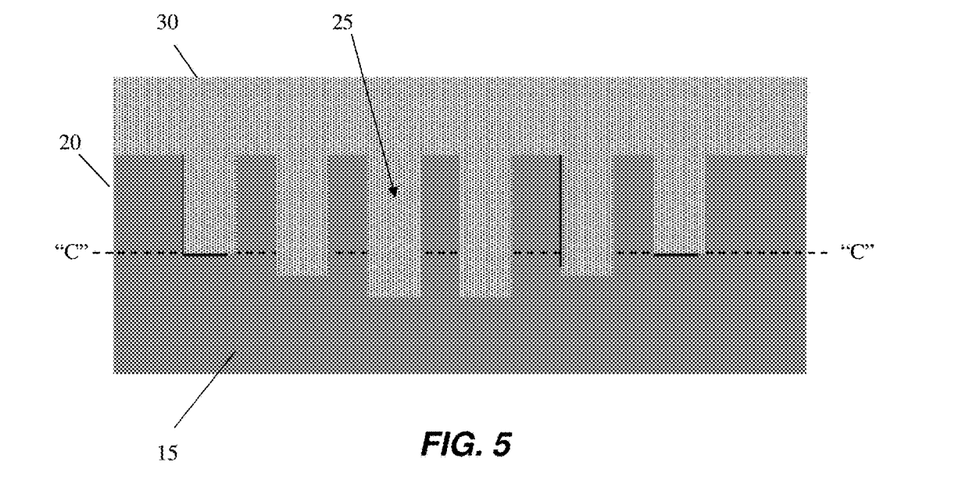
FIG. 5 shows materials formed on the substrate which generate a stress component and respective fabrication processes in accordance with aspects of the present disclosure.

In FIG. 5, the trenches 25 are filled with epitaxial grown strain materials as represented by reference numeral 30. In embodiments, the epitaxial grown strain materials 30 can be a plurality of alternating layers of GaN and AlN. In embodiments, the thickness of these layers 30 can range from about 1.0 microns to about 10.0 microns, although other thicknesses are contemplated herein. For example, the thickness of the AlN layer can be less than 0.5 microns. In alternative embodiments, the epitaxial grown materials can be a plurality of alternating layers of carbon based materials and AlN. The grown materials can be deposited using a conventional deposition process, e.g., chemical vapor deposition (CVD), followed by a planarization process. The planarization process can be a chemical mechanical planarization (CMP) process.

Figure 6:
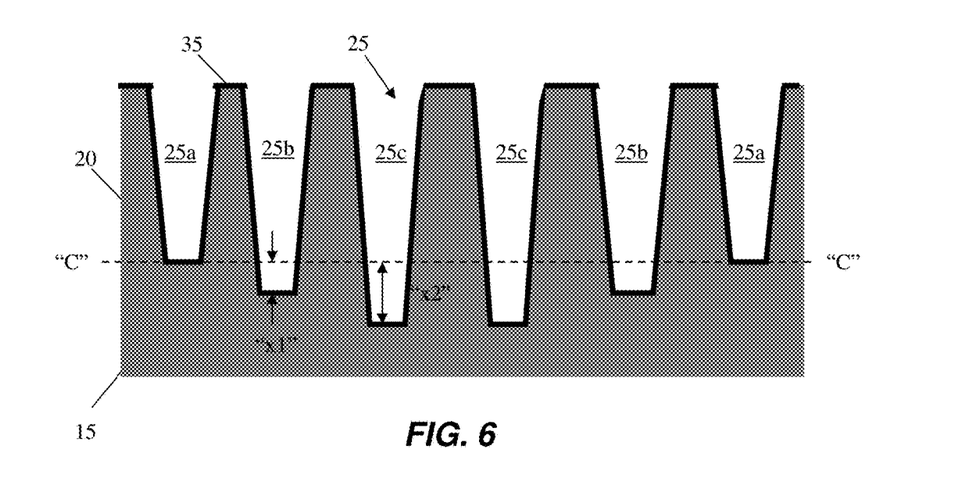
FIG. 6 shows a reflective material lining trenches and a surface of the substrate and respective fabrication processes in accordance with aspects of the present disclosure.

As shown in FIG. 6, the trenches 25 and surface of the substrate 15 can be coated with a reflective material 35 prior to the deposition of the epitaxial grown strain materials 30. The reflective material 35 is provided in the plurality of trenches 25 and is disposed directly underneath and in contact with a lowermost layer of the plurality of layers, e.g., epitaxial grown strain materials 30. The reflective material 35 is thus structured to act as contact to a bottom part of an active device. In embodiments, the reflective material 35 can be deposited to a thickness of about 3 nm to about 20 nm; although other dimensions are also contemplated herein. In more specific embodiments, the reflective material 35 is grown epitaxially by MOCVD or MBE type processes to preserve lattice crystalline structure of the material above.

It should be understood that although the trenches 25 are shown to be a trapezoidal profile, these trenches can be of any profile described herein. In embodiments, the reflective material 35 can be sapphire ($Al_2O_3$) or any other metallic reflective element coating the entire surface of the substrate 15. The reflective material 35 can be deposited to a thickness of about 3 nm to about 20 nm, using a CVD process.

Figure 7:
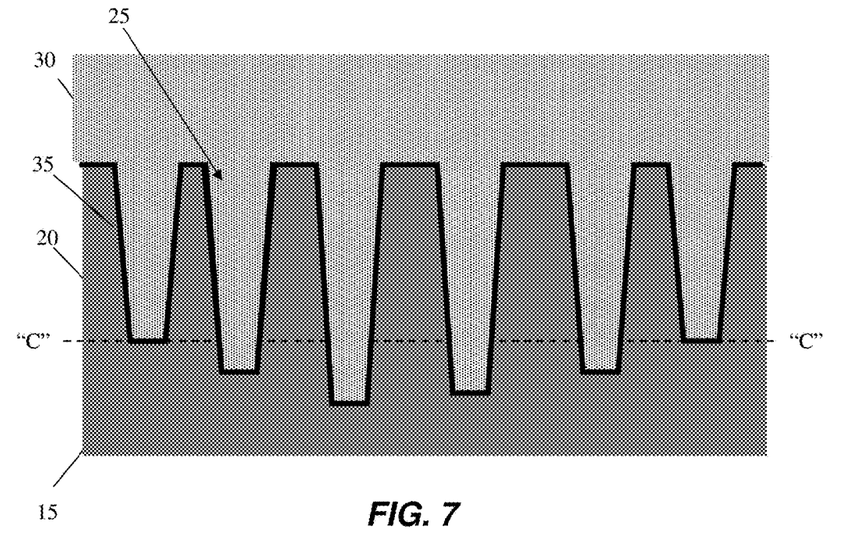
FIG. 7 shows materials formed on the reflective material lining of FIG. 6 and which generate a stress component, and respective fabrication processes in accordance with aspects of the present disclosure.

In FIG. 7, the trenches 25 are filled with the epitaxial grown strain materials 30. More specifically, the epitaxial grown materials 30 are deposited on the reflective material 35. As previously described, the epitaxial grown strain materials 30 can be a plurality of alternating layers of GaN and AlN, deposited to a thickness ranging from about 1.0 microns to about 10.0 microns, although other thicknesses are contemplated herein. In alternative embodiments, the epitaxial grown strain materials 30 can be a plurality of alternating layers of carbon based materials and AlN.

Figure 8:
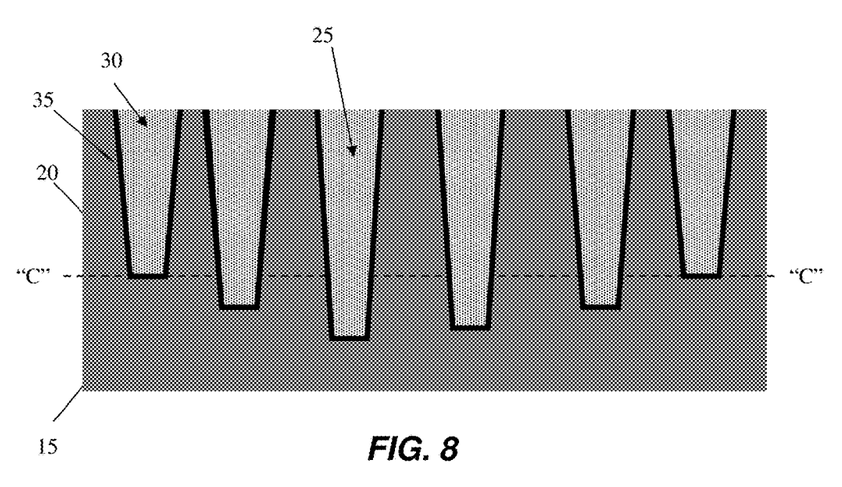
FIG. 8 shows a planarized surface of the materials of FIG. 7, and respective fabrication processes in accordance with aspects of the present disclosure.

As shown in FIG. 8, the epitaxial grown strain materials 30 are planarized to remove any defective material. In embodiments, the epitaxial grown strain materials 30 can be planarized by a CMP process, which can expose the surface of the substrate 15. In this way, the remaining epitaxial grown strain materials 30 within the trenches can be used as diodes, as an example.

Figure 9A:
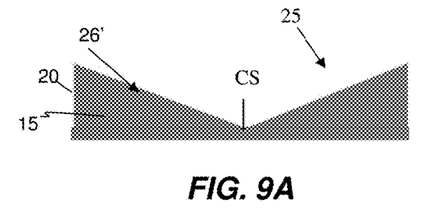
FIGS. 9A-9D show alternative cross-sectional profiles of trenches formed in a substrate, along a length thereof, and respective fabrication processes in accordance with aspects of the present disclosure.
Figure 9B:
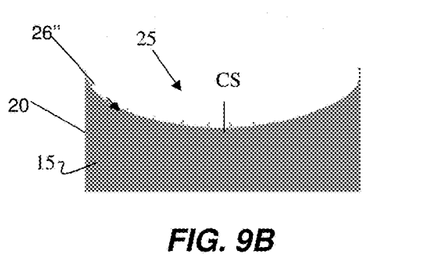

FIGS. 9A-9D show alternative cross-sectional profiles of the trenches 25 formed in the substrate 15, along a length thereof, and respective fabrication processes in accordance with aspects of the present disclosure. More specifically, these alternative profiles can be representative of cross-sectional views of the trenches 25 shown in FIG. 1A, along line "B"-"B". For example, FIG. 9A show a trench 25 with a sloped surface 26' which becomes deeper as it approaches a center ("CS") of the substrate 15 (e.g., extends radially inward from an edge toward a center). In this embodiment, the sloped surface 26' has linear or constant slope. Similarly, FIG. 9B shows a trench 25 with a sloped surface 26" which becomes deeper as it approaches the center ("CS") of the substrate 15. In this example, though, the sloped surface has a variable angle or slope, e.g., parabolic concave surface. Both of these configurations would be used for a substrate which is coated with a compressive strain material that generates a concave bowing of the substrate 15.

Figure 9C:
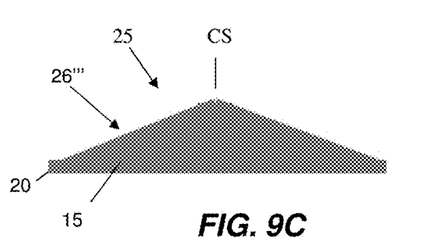
Figure 9D:
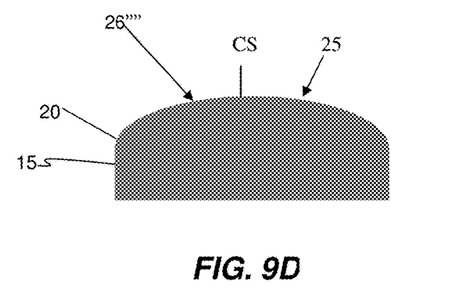

On the other hand, FIG. 9C shows a trench 25 with a sloped surface 26''' which becomes shallower as it approaches a center ("CS") of the substrate 15. Said otherwise, the trench 25 becomes deeper as it approaches the edge 20 of the substrate 20 (e.g., extends radially outward from a center to the edge). In this embodiment, the sloped surface 26''' has linear or constant slope. Similarly, FIG. 9D shows a trench 25 with a sloped surface 26'''' which becomes deeper as it approaches the edge 20 of the substrate 15. In this example, though, the sloped surface has a variable angle or slope, e.g., parabolic convex surface. Both of these configurations would be used for a substrate which is coated with a tensile material that generates a convex bowing of the substrate 15.

In embodiments, each of the trenches shown in FIGS. 9A-9D (or any of the embodiment described herein) are formed by lithography and etching processes with different methodologies, resulting in different surface topographies. For example, to obtain a different depth of the trenches, e.g., forming aspect ratio trapping trenches, the etch process can be varied radially about a circumference of the substrate 15.

Alternatively, the post-develop resist profile can be varied by exposure to a varying dose of energy resulting in different thicknesses of the resist, followed by an etching process. More specifically, in the examples of FIGS. 9A and 9B, the post-develop resist profile varies from thick to thin to thick; whereas, in the examples of FIGS. 9C and 9D, the post-develop resist profile varies from thin to thick to thin. This can be followed by an etching process, e.g., RIE, to transfer the resist profile to the exposed surface of the substrate 15, resulting in a varying depth profile of the trenches 25.

In alternative embodiments, the different surface profiles can be formed by tilting inductors in the etch chamber to induce a power gradient distribution during etch to intentionally etch a sloped surface, e.g., resulting in a different depth along the length of the trenches. In still further alternative processes, the gas flow in the etch chamber can be modulated to create a gradient density of plasma, resulting in sloped etch profiles shown in FIGS. 9A-9D.

Figure 10:
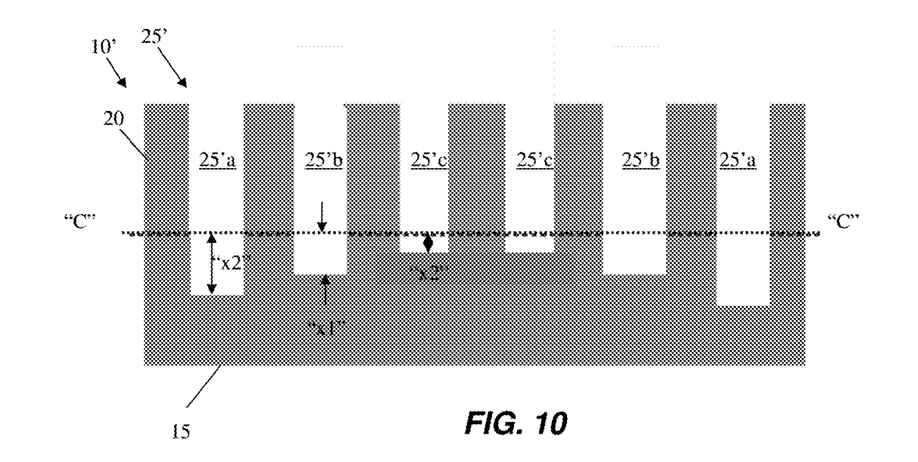
FIG. 10 shows a cross-sectional view of an alternative structure in accordance with aspects of the present disclosure.

FIG. 10 shows a cross-sectional view of an alternative structure in accordance with aspects of the present disclosure. In particular, in this structure 10', for example, portions of the trenches 25'c closest to the center of the substrate 15 will have a depth less than portions of the trenches 25'b and trenches 25'a, farther from the center of the substrate 15, e.g., x2<x1<x0 with respect to line "C"-"C". Accordingly, each trench 25'a, 25'b and 25'c can include a sloped surface such that the portion of the trench closest to the center point of the substrate will have the shallowest profile in the case of compensating for a convex bowing of the substrate 15.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising a substrate comprising at least three trenches which have progressively increasing depths as they extend radially inwardly from an edge of the substrate towards a center of the substrate.

2. A structure comprising a substrate comprising a plurality of trenches which have progressively different depths as they extend radially inwardly from an edge of the substrate towards a center of the substrate and a plurality of layers having a compressive component, the plurality of layers being disposed within at least each of the plurality of trenches.

3. The structure of claim 2, further comprising a reflective coating which is directly underneath and in contact with a lowermost layer of the plurality of layers.

4. The structure of claim 2, wherein the depths of the trenches become deeper as they extend radially inwardly from the edge of the substrate.

5. The structure of claim 4, wherein:
each of the plurality of trenches extend longitudinally across the substrate from edge to edge; and
each of the plurality of trenches have a varying depth which becomes deeper as it extends radially inwardly from the edge of the substrate.

6. The structure of claim 2, wherein:
each of the plurality of trenches are discrete trenches throughout the substrate;
each of the plurality of trenches has a uniform cross section; and
the discrete trenches become progressively deeper as they extend radially inwardly from the edge of the substrate.

7. The structure of claim 1, wherein the at least three trenches have one of a trapezoidal, U-shaped, stepped, V-shaped and rectangular cross-sectional profile.

8. A structure comprising a substrate comprising a plurality of trenches which have progressively different depths as they extend radially inwardly from an edge of the substrate towards a center of the substrate and a plurality of layers having a tensile component within at least each of the plurality of trenches.

9. The structure of claim 8, wherein:
each of the plurality of trenches extend longitudinally across the substrate from edge to edge; and
each of the plurality of trenches have a varying depth which becomes deeper as it extends radially outward from the center and toward the edge of the substrate.

10. The structure of claim 8, wherein:
each of the plurality of trenches are discrete trenches throughout the substrate;
each of the plurality of trenches has a uniform cross section; and
the discrete trenches become progressively deeper as they extend radially outward from the center and toward the edge of the substrate.

11. A structure, comprising:
a substrate;
a plurality of trenches formed in the substrate and having progressively different depths as they extend radially inwardly from an edge of the substrate towards a center of the substrate; and
a plurality of layers which generate a stress component on the substrate wherein one of:
the stress component is a compressive stress which causes a concave bowing of the substrate and the progressively different depths of the plurality of trenches comprises a deeper profile as the trenches extend radially inward from the edge of the substrate; and
the stress component is a tensile stress which causes a convex bowing of the substrate and the progressively different depths of the plurality of trenches comprises a deeper profile as the trenches extend radially outward from a center to the edge of the substrate.

12. The structure of claim 11, wherein when the stress component is stress component is a compressive stress, further comprising a reflective coating provided in the plurality of trenches and disposed directly underneath and in contact with a lowermost layer of the plurality of layers, wherein the reflective coating is structured to act as contact to a bottom part of an active device.

13. The structure of claim 11, wherein when the stress component is stress component is a compressive stress:
each of the plurality of trenches extend longitudinally across the substrate from edge to edge; and
each of the plurality of trenches have a varying depth which becomes deeper as it extends radially inwardly from the edge of the substrate.

14. The structure of claim 11, wherein when the stress component is stress component is a compressive stress:
each of the plurality of trenches are discrete trenches throughout the substrate; and
the discrete trenches become progressively deeper as they extend radially inwardly from the edge of the substrate.

15. The structure of claim 11, wherein the plurality of trenches have one of a trapezoidal, U-shaped, stepped, V-shaped and rectangular cross-sectional profile.

16. The structure of claim 11, wherein when the stress component is stress component is a tensile stress:
each of the plurality of trenches extend longitudinally across the substrate from edge to edge; and
each of the plurality of trenches have a varying depth which becomes deeper as it extends radially outward from a center to the edge of the substrate.

17. The structure of claim 11, wherein when the stress component is stress component is a tensile stress:
each of the plurality of trenches are discrete trenches throughout the substrate; and
the discrete trenches become progressively deeper as they extend radially outward from a center to the edge of the substrate.

* * * * *